(12) United States Patent
Wang et al.

(10) Patent No.: US 7,868,729 B2
(45) Date of Patent: Jan. 11, 2011

(54) STACKED DEVICE ASSEMBLY WITH INTEGRATED COIL AND METHOD OF FORMING SAME

(75) Inventors: James Jen-Ho Wang, Phoenix, AZ (US); Carl E. D'Acosta, Mesa, AZ (US); Justin E. Poarch, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/397,112

(22) Filed: Mar. 3, 2009

(65) Prior Publication Data
US 2010/0225434 A1 Sep. 9, 2010

(51) Int. Cl.
*H01F 5/00* (2006.01)

(52) U.S. Cl. .................. 336/223; 336/200; 336/232; 29/602.1

(58) Field of Classification Search .................. None
See application file for complete search history.

(56) References Cited

U.S. PATENT DOCUMENTS

| | | | |
|---|---|---|---|
| 6,724,079 B2 | 4/2004 | Viswanathan et al. | |
| 6,844,221 B2 | 1/2005 | Viswanathan et al. | |
| 6,998,952 B2 | 2/2006 | Zhou et al. | |
| 7,132,303 B2 | 11/2006 | Wang et al. | |
| 7,264,986 B2 | 9/2007 | Gogoi | |
| 7,279,795 B2 * | 10/2007 | Periaman et al. | 257/777 |
| 7,429,798 B2 | 9/2008 | Kim | |
| 2006/0214299 A1 * | 9/2006 | Fairchild et al. | 257/758 |
| 2007/0257761 A1 * | 11/2007 | Mano et al. | 336/200 |
| 2007/0268105 A1 * | 11/2007 | Walls | 336/200 |
| 2008/0079115 A1 | 4/2008 | Wang | |
| 2009/0115067 A1 * | 5/2009 | Okimoto et al. | 257/774 |
| 2009/0146315 A1 * | 6/2009 | Shim et al. | 257/777 |
| 2010/0007032 A1 * | 1/2010 | Gallegos | 257/777 |
| 2010/0078828 A1 * | 4/2010 | Huang et al. | 257/777 |

* cited by examiner

*Primary Examiner*—Anh T Mai
(74) *Attorney, Agent, or Firm*—Meschkow & Gresham, P.L.C.

(57) ABSTRACT

A stacked semiconductor device assembly (20) includes a device (24) having conductive traces (34) formed therein, and conductive interconnects (28) electrically connected to the conductive traces (34). Another device (26) has conductive traces (44) formed therein and device pads (54) formed on an outer surface (52) of the device (26). A method (120) entails attaching (84) a magnetic core (30) to an outer surface (42) of the device (24) and forming (92) the conductive interconnects (28) on the outer surface (42) using a stud bumping technique such that the interconnects (28) surround the magnetic core (30). The conductive interconnects (28) are coupled (126) with the device pads (54) using thermocompression bonding to couple the device (26) with the device (24) to form a continuous device coil (22) wrapped around the magnetic core (30) from an alternating electrical connection of the traces (34), the conductive interconnects (28), and the traces (44).

20 Claims, 12 Drawing Sheets

US 7,868,729 B2

STACKED DEVICE ASSEMBLY WITH INTEGRATED COIL AND METHOD OF FORMING SAME

TECHNICAL FIELD OF THE INVENTION

The present invention relates generally to electronic devices and processes. More specifically, the present invention relates to electronic devices that include device coils, such as inductors, transformers, and the like, and processes of forming the same.

BACKGROUND OF THE INVENTION

A "system-in-a-package" (SIP) or a "chip stack," refers to a semiconductor device that incorporates multiple chips that make up a complete electronic system enclosed in a single package or module. In an SIP, dies containing integrated circuits may be stacked vertically. They are internally connected by fine wires that are bonded to the package. Alternatively, with a flip chip technology, solder bumps may be used to join stacked chips together.

An exemplary SIP can contain several chips, such as a specialized processor, dynamic random access memory (DRAM), flash memory, and so forth, combined with passive components, such as resistors, capacitors, and the like. Thus, a complete functional unit may be built in a multi-chip package so that few external components need to be added to make it work. The single package approach of SIP allows for tremendous space savings and significant down-sizing of the electronic devices in which they are incorporated. Thus, such stacked device assemblies are particularly valuable in spaced constrained environments such as mobile phones, digital music players, and the like.

Within electronic devices, the formation of transistors, diodes, capacitors, and resistors at least partially within a substrate is conventional. Some devices can include devices coils. These device coils are implemented, for example, as inductors and transformers. Device coils known as planar inductors have been formed, by laying out a trace in a spiral pattern on a substrate. Unfortunately, however, the small dimensions of such planar inductors limit their inductance. In addition, they can possess characteristics that are undesirable. For example, the planar inductor can generate an electromagnetic flux when it is operating that is substantially perpendicular to the major surface of the substrate. This electromagnetic flux can cause adverse affects.

Non-planar inductors may alternatively be employed. A non-planar inductor can include a plurality of spaced-apart conductive traces that are electrically connected by wirebonds via device bonding pads. The non-planar configuration of such inductors can mitigate the problems associated with electromagnetic flux. However, the inductance value of the non-planar inductors can be undesirably low due to the limited number of turns of the coil that are possible within the limited confines of an SIP, or stacked semiconductor device assembly, and due to size limitations of the device bonding pads and the wirebonds.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

A stacked semiconductor device assembly can include a non-planar device coil that may be implemented to form a non-planar inductor. In an aspect, the stacked device assembly includes conductive traces formed in a first semiconductor device and conductive traces formed in a second semiconductor device. Conductive interconnects interconnect the conductive traces of the first semiconductor device with the conductive traces of the second semiconductor device to form a continuous device coil formed from alternating the electrical connection of the conductive traces of the first device with the conductive traces of the second device. In accordance with an embodiment, a large value non-planar inductor can be formed in a stacked semiconductor device assembly through the implementation of the two sets of conductive traces having a fine pitch combined with strategically oriented conductive interconnects having a larger pitch. Inductance values greater than 100 nanohenries, and more particularly in the range of 0.5 to 50 microhenries, may be achieved through implementation of the non-planar inductor of the invention.

Figure 1:
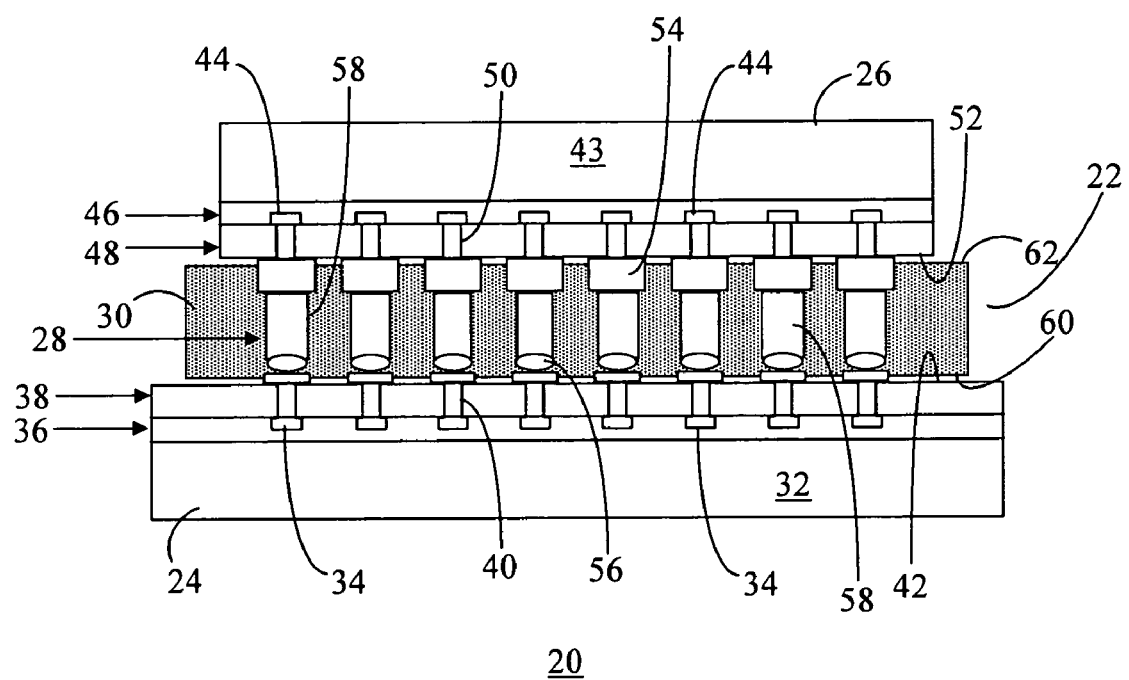
FIG. 1 shows a side view of a stacked semiconductor device assembly with an integrated device coil.

FIG. 1 shows a side view of a stacked semiconductor device assembly 20 with an integrated device coil 22. Device assembly 20 includes a first semiconductor device, referred to herein as an integrated circuit 24, and a second semiconductor device, referred to herein as a semiconductor device 26, positioned over integrated circuit 24. Device assembly 20 further includes a plurality of conductive interconnects 28 and a magnetic core 30 interposed between integrated circuit 24 and semiconductor device 26.

Integrated circuit 24 includes functional circuitry 32 for performing various integrated circuit applications, such as for example, communications, transportation, general computation, entertainment, and so forth. Thus, functional circuitry 32 may include active and passive components, such as, a discrete power device, a compound semiconductor device, a memory device, a microelectromechanical systems (MEMS) device, an optical device, and so forth. It should be noted that integrated circuit 24 also includes interconnects, contacts, traces, and the like (not shown) that provide electrical connection between the various functional circuitry 32 within integrated circuit 24 and that provide electrical connection between integrated circuit 24 and external devices (not shown). These details are not provided herein for clarity of illustration.

In accordance with an embodiment, integrated circuit 24 further includes a plurality of conductive traces 34 formed at an interconnect level 36. An insulating layer 38 may be formed overlying conductive traces 34. Openings are formed in insulating layer 38 to expose portions of conductive traces 34. The openings are filled with a conductive material to form conductive vias 40 that extend from conductive traces 34 to an outer surface 42 of integrated circuit 24.

Semiconductor device 26 desirably includes a number of passive components 43, e.g., resistors, capacitors, etc., that are needed to carry out the functionality of stacked device assembly 20. Semiconductor device 26 can be implemented in device assembly 20 so that passive components 43 are not built into the more complex, hence costly, integrated circuit 24, and so that additional space is not required surrounding the integrated circuit 24 for external placement of passive components 43. Like integrated circuit 24, semiconductor device 26 may also include interconnects, contacts, traces, and the like (not shown) that provide electrical connection between the various components within semiconductor device 26 and that provide electrical connection between semiconductor device 26 and integrated circuit 24, as well as between semiconductor device 26 and external devices (not shown). Again, these details are not provided herein for clarity of illustration.

In accordance with the embodiment, semiconductor device 26 further includes a plurality of conductive traces 44 formed at an interconnect level 46. An insulating layer 48 may be formed overlying conductive traces 44. Openings 50 are formed in insulating layer 48 and extend between portions of conductive traces 44 at interconnect level 46 and an outer surface 52 of semiconductor device 26. Device pads 54 are formed at selected locations on outer surface 52 of semiconductor device 26. In particular, device pads 54 are patterned over outer surface 52 at openings 50 and extend over insulating layer 48 surrounding openings 50. Formation of device pads 54 with conductive material may concurrently result in openings 50 being filled with the conductive material of device pads 54. Alternatively, a process step may be performed to first fill openings 50 with a conductive material prior to forming device pads 54 on outer surface 52. The filled openings 50 allow for electrical connection between conductive traces 44 and device pads 54. Those skilled in the art will recognize that device pads 54 and the interconnects, i.e., filled openings 50, may be formed by other methods in other embodiments.

Conductive interconnects 28 extend above outer surface 42 of integrated circuit 24 and are in electrical communication with conductive vias 40. Accordingly, conductive vias 40 allow for electrical connection between conductive traces 34 and conductive interconnects 28. In an embodiment, conductive interconnects 28 are stud bumps formed on outer surface 42 at conductive vias 40 utilizing a stud bumping technique. Stud bumping is a variant of ball bonding. In stud bumping, a wire, typically gold or copper, is fed through a capillary of a ball bonding machine. An electric charge is applied to the wire, which melts the wire at the tip of the capillary. The tip of the wire forms into a ball due to the surface tension of the molten metal.

The ball solidifies, and the capillary is lowered to the desired surface, in this case to conductive vias 40 on outer surface 42 which has been heated. The ball bonding machine pushes down on the capillary and applies ultrasonic energy. The combined heat, pressure, and ultrasonic energy create a weld between the ball and outer surface 42. The wire is passed out through the capillary and is subsequently cut. This forms a stud bump having a ball 56 welded to outer surface 42 at one of conductive vias 40 and a post 58 extending from outer surface 42.

Conductive interconnects 28 are coupled with corresponding device pads 54. In an embodiment, conductive interconnects 28 and device pads 54 are formed from a noble metal. A noble metal is a metal that is resistant to corrosion or oxidation. The noble metals include ruthenium, rhodium, palladium, osmium, iridium, platinum, and gold. In accordance with conventional wire bonding and stud bumping techniques, conductive interconnects 28 and device pads 54 are formed from gold.

Conductive interconnects 28 may be coupled with device pads 54 using a thermal compression bonding technique. Thermal compression bonding involves heating outer surface 52 of semiconductor device 26 to approximately two hundred degrees Celsius and then pressing conductive interconnects 28 to be bonded to corresponding ones of device pads 54 with a predetermined pressure (e.g., from 5,000 to 10,000 lb/sq inch). A bond with excellent physical and electrical properties is subsequently formed. A noble metal, such as gold, is preferably utilized for both conductive interconnects 28 and device pads 54 for its resistance to corrosion or oxidation so that oxide need not be removed prior to bonding. In an alternative embodiment, if either of conductive interconnects 28 or device pads 54 is not a noble metal, an additional operation of oxide break-down by, for example, an ultrasonic scrub, wet etch, or plasma clean may be required prior to bonding.

In an embodiment, device pads 54 may be formed sufficiently thick to carry large currents, to sustain probing with probe needles without damage, and to largely withstand impact damage to device pads 54 and/or the underlying structure of semiconductor device 26 during thermal compression bonding. In addition, device pads 54 may be formed sufficiently large enough to overlie a portion of insulating layer 48. Insulating layer 48 may provide a cushioning effect to minimize damage due to thick film stress and to minimize impact damage during thermal compression bonding.

Magnetic core 30 is interposed between integrated circuit 24 and semiconductor device 26 such that conductive interconnects 28 are positioned on opposing sides of magnetic core 30. In addition, opposing surfaces 60, 62 of magnetic core 30 abut corresponding outer surfaces 42, 52 of integrated circuit 24 and semiconductor device 26. The thickness of magnetic core 30 between opposing surfaces 60, 62 establishes the proximity of conductive traces 34 and 44 to one another. In other words, the thickness of magnetic core 30 controls the height of the non-planar device coil 22 during thermal compression bonding of conductive interconnects 28 with device pads 54.

In an embodiment, device coil 22 is an inductor. As known to those skilled in the art, an inductor is a passive component that can store energy in a magnetic field created by the electric current passing through it. An inductor is typically constructed as a coil, e.g., device coil 22, wrapped around a core of either air or of ferromagnetic material. Magnetic core 30 has a higher permeability than air. Thus, inclusion of magnetic core 30 surrounded by device coil 22 increases the magnetic field and confines it closely to device coil 22, thereby increasing the inductance of device coil 22 relative to a core of air.

Process flow for providing stacked semiconductor device assemblies 20 having integrated device coils 22 entails providing an integrated circuit (IC) wafer having a plurality of integrated circuits 24 fabricated thereon, providing semiconductors devices 26, and subsequently forming stacked semiconductor assemblies 20. An IC wafer production process is discussed in connection with FIGS. 3-6. A semiconductor device production process is discussed in connection with FIGS. 7-9, and a stacked semiconductor device assembly production process is discussed in connection with FIG. 10.

Figure 2:
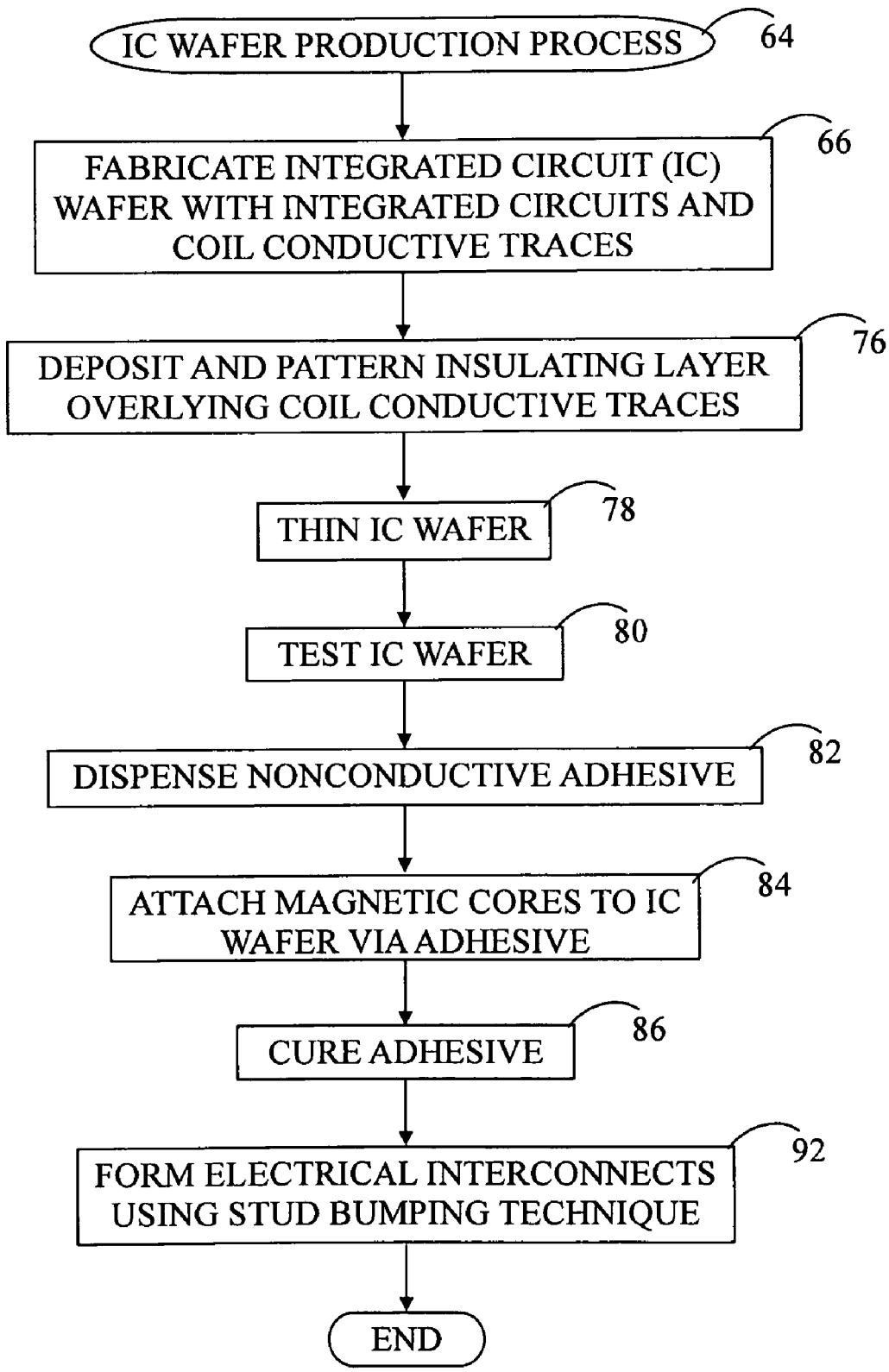
FIG. 2 shows a flowchart of an integrated circuit (IC) wafer production process.

FIG. 2 shows a flowchart of an integrated circuit (IC) wafer production process 64. Process 64 is performed to produce a plurality of integrated circuits 24, each of which includes conductive traces 34 formed at interconnect level 36.

IC wafer production process 64 begins with a task 66. At task 66, an integrated circuit (IC) wafer is fabricated to include integrated circuits 24 and conductive traces 34 that make up a portion of device coil 22 (FIG. 1). Task 66 entails the implementation of standard IC wafer process steps to create transistors, capacitors, resistors, diodes, and all other components of functional circuitry 32 (FIG. 1). These conventional process steps need not be described herein. In addition, task 66 entails the implementation of the standard IC wafer process steps to form conductive traces 34.

Figure 3:
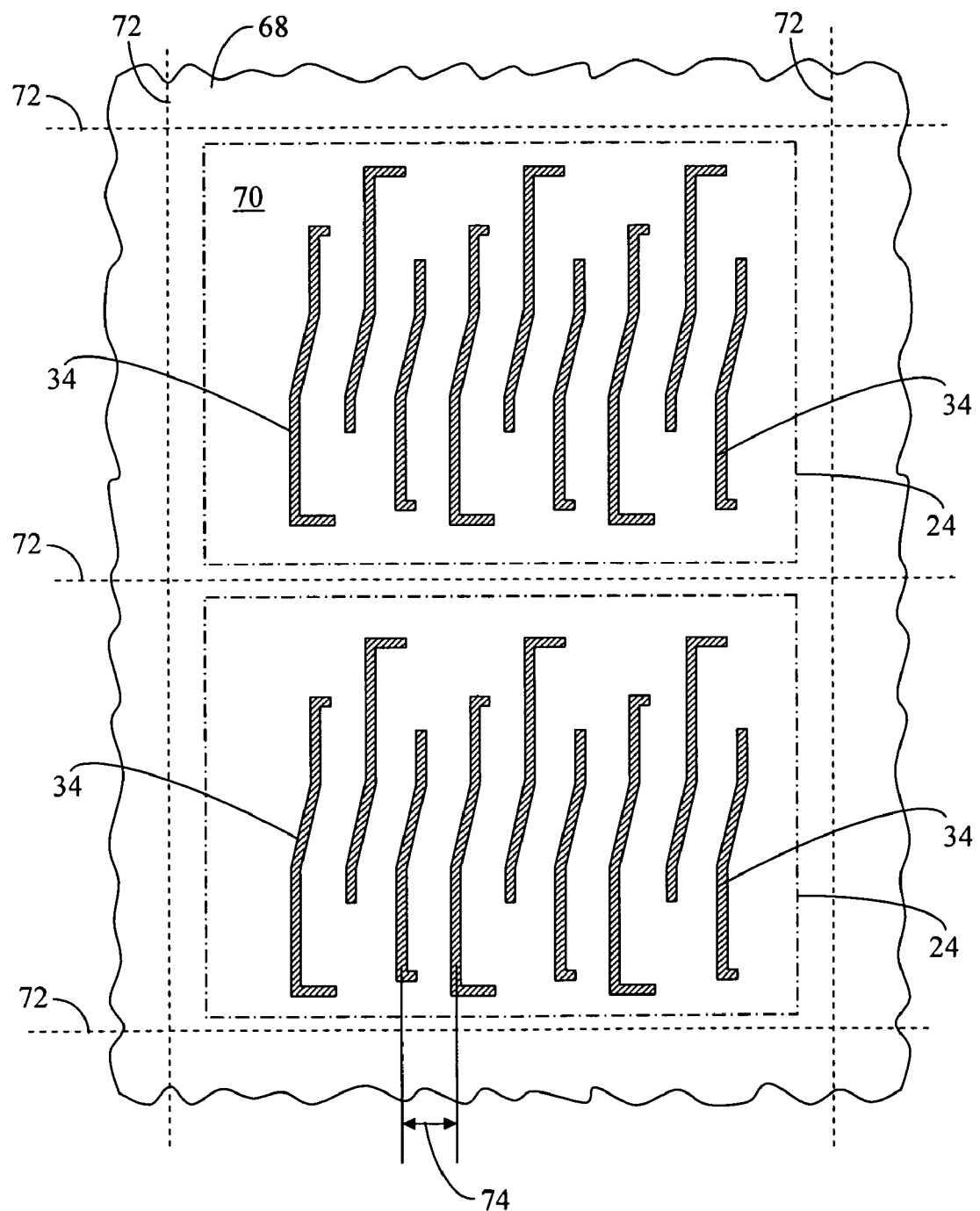
FIG. 3 shows a top view of a portion of an integrated circuit (IC) wafer having conductive traces formed thereon.

Referring to FIG. 3 in connection with task 66, FIG. 3 shows a top view of a portion of an integrated circuit (IC) wafer 68 having conductive traces 34 formed thereon. IC wafer 68 is subjected to conventional fabrication techniques for forming functional circuitry 32 (not shown) in the active regions, or substrate, of IC wafer 68. The substrate of IC wafer 68 may be any type of semiconductor substrate, such as, for example, a silicon substrate, a silicon germanium substrate, a gallium arsenide substrate, a silicon-on-insulator substrate, or any other type of semiconductor-on-insulator substrate.

In an embodiment, after functional circuitry 32 (FIG. 1) is formed in the underlying layers of IC wafer 68, an adhesion/barrier layer 70 may be deposited using a conventional deposition method. Conductive traces 34 may then be formed over adhesion/barrier layer 70 at interconnect level 36 (FIG. 1). Of course, additional contacts (not shown) may be formed over adhesion/barrier layer 70 in connection with the formation of conductive traces 34. These additional contacts may interconnect with the underlying functional circuitry and are electrically isolated from conductive traces 34. Note that IC wafer 68 is illustrated with only two sets of conductive traces 34 separated by dashed lines representing saw lines 72 along which IC wafer 68 will later be sawn, diced, or otherwise separated. Thus, saw lines 72 represent the separation between each integrated circuit 24 (represented by dash-dot-dash lines) in IC wafer 68. Although only two integrated circuits 24 are represented in FIG. 3, it should be understood that conventional wafers allow for hundreds and often thousands of such integrated circuits 24 on one IC wafer 68.

Conductive traces 34 may be formed by conventional deposition, patterning, and etching processes of a conductive material layer. The conductive material layer may be formed from aluminum, copper, and the like. In an embodiment, conductive traces 34 are arranged substantially parallel to one another and exhibit a pitch 74. The term "pitch" is intended to mean a sum or a width of a feature and a space between two adjacent features at substantially the same level of elevation within an electronic device. In this situation, pitch 74 represents the separation between centers of adjacent conductive traces 34 within interconnect level 36. Conventional wafer fabrication of aluminum or copper conductive traces 34 can result in pitch 74 being approximately two micrometers.

Referring back to FIG. 2, following task 66, IC wafer production process 64 continues with a task 76. At task 76, insulating layer 38 may be deposited over conductive traces 34 of interconnect level 36 (FIG. 1). Insulating layer 38 may include a photo-imageable layer of polyimide coated using a conventional or proprietary spin-on process. The polyimide insulating layer 38 can be developed or etched using conventional or proprietary processing to define openings in which conductive material will be deposited to form conductive vias 40 (FIG. 1). If necessary or desired, insulating layer 38 may be cured at elevated temperatures to release a volatile organic compound, moisture, or any combination thereof.

Following task 76, a task 78 is performed. At task 78, IC wafer 68 may be thinned. For example, the back side of IC wafer 68 may be ground to create a thinner IC wafer 68 to better fit inside thin packages.

Next, a task 80 is performed. At task 80, IC wafer 68 is tested. Testing may entail probing contacts (not shown) to test the electrical functionality of each integrated circuit 24 on IC wafer 68 in accordance with known procedures, as well as to verify that conductive traces 34 are electrically isolated from one another. Any integrated circuit 24 that fails testing may be electronically mapped, identified, or inked to mark that it failed. Wafer level burn-in may also be performed on the entire IC wafer assembly before further packaging per known procedures.

Following task 80, IC wafer production process continues with a task 82. At task 82, a non-conductive adhesive is dispensed over IC wafer 68. In various embodiments, the adhesive may be one of a nonconductive epoxy, a nonconductive polyimide, a nonconductive double-faced adhesive tape or its equivalent. These non-conductive adhesives are conventionally utilized for die-to-die adhesion in die stacked packages, and for attaching integrated circuits and components in standard ball grid array structures or lead frames.

Next, a task 84 is performed. At task 84, magnetic cores, e.g., magnetic core 30, are coupled to IC wafer 68 via the non-conductive adhesive.

Following task 84, a task 86 may be performed. Following adhesion of magnetic cores 30 to IC wafer 68, the adhesive may be allowed to cure at or above room temperature.

Figure 4:
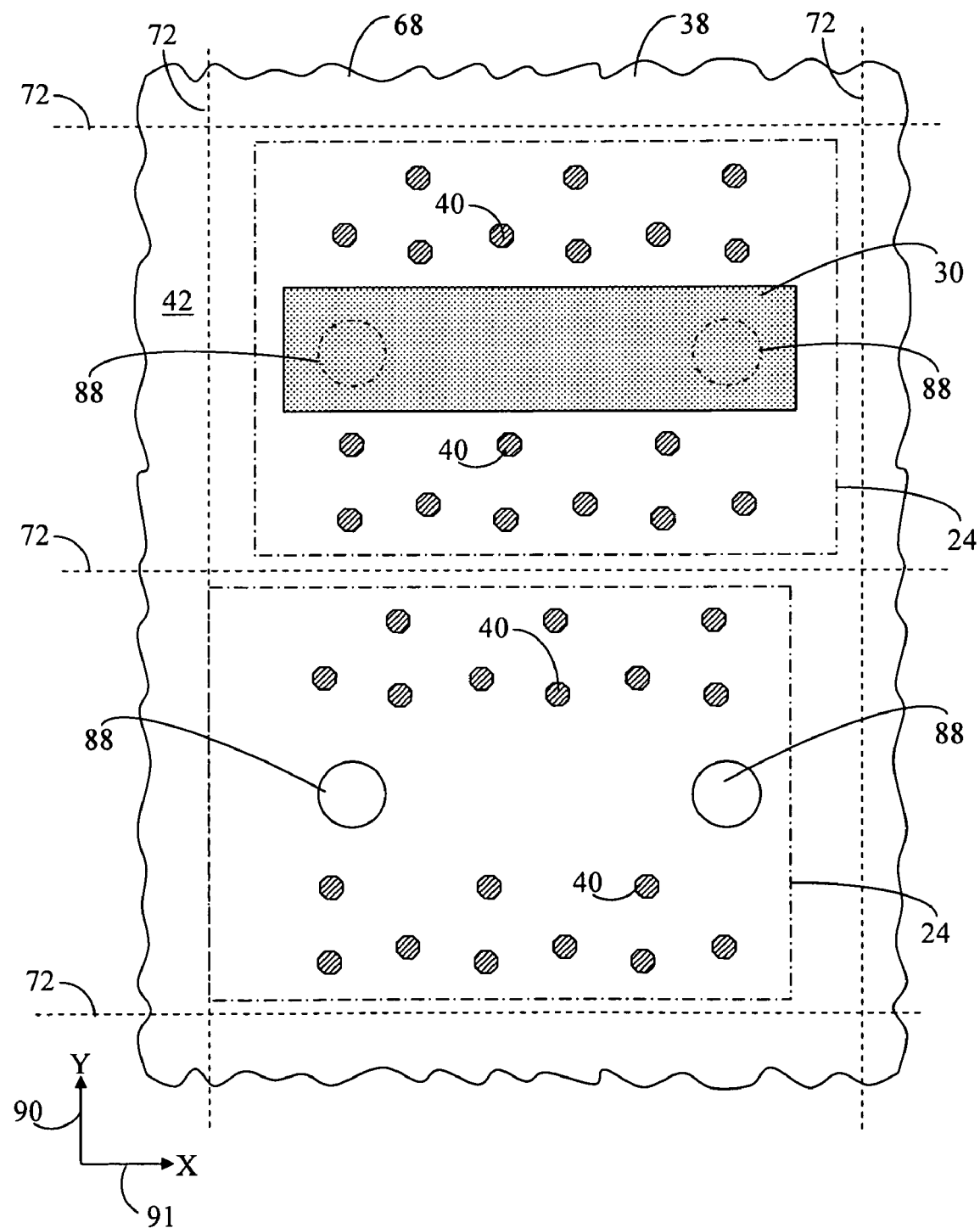
FIG. 4 shows a top view of the portion of the IC wafer of FIG. 3 further along in processing.

Referring to FIG. 4 in connection with IC wafer production process 64, FIG. 4 shows a top view of the portion of the IC wafer of FIG. 3 further along in processing. In accordance with task 76 of process 64, insulating layer 48 is deposited over adhesion/barrier layer 70 (FIG. 3) and conductive traces 34 (FIG. 3) to form outer surface 42 of integrated circuits. In addition, conductive vias 40 are formed through insulating layer 48 and extend between the underlying conductive traces 34 and outer surface 42.

In accordance with task 82 of process 64, nonconductive adhesive dots 88 are dispensed at select locations on outer surface 42. Further in accordance with task 84, one of magnetic cores 30 is coupled to outer surface 42 of one of integrated circuits 24 via adhesive dots 88. FIG. 4 is shown with adhesive dots 88 exposed on one of integrated circuits 24, and adhesive dots 88 hidden by magnetic core 30 for illustrative purposed. It should be understood that execution of coupling task 84 results in all of adhesive dots 88 being covered by associated magnetic cores. Magnetic core 30 is illustrated in FIG. 4 as being generally rectangular in shape for simplicity of illustration. Such is not a limitation of the invention. In alternate embodiments, magnetic core 30 may have other shapes, for example, a circular shape, a toroidal shape, and so forth.

Figure 5:
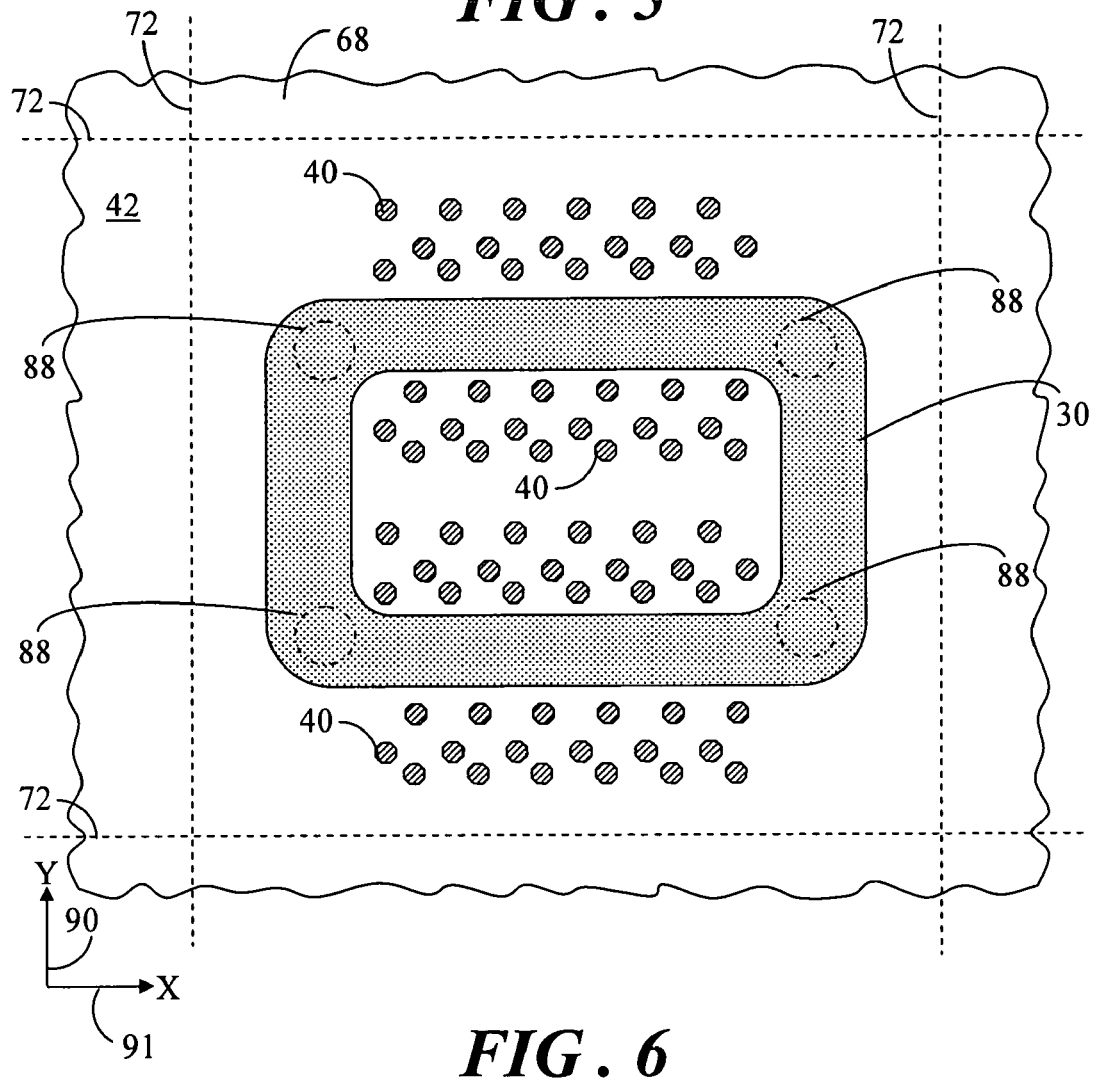
FIG. 5 shows a top view of the portion of the IC wafer onto which a toroidal magnetic core is attached.

FIG. 5 shows a top view of a portion of IC wafer 68 in which magnetic core 30 is a toroidal core. Device coils 22 (FIG. 1) of a toroidal coil configuration generate flow that does not disperse towards the exterior. Thus, such a toroidal configuration results in a closed magnetic flux, thus providing enhanced performance and precision.

With continued reference to both of FIGS. 4 and 5, it should be noted that conductive vias 40 surround magnetic core 30. That is, conductive vias 40 are arranged on opposing sides of magnetic core 30. In the configuration illustrated in FIG. 5, conductive vias 40 are additionally arranged in the interior opening of the toroid-shaped magnetic core 30. This arrangement corresponds with the orientation of device pads 54 (FIG. 1) on outer surface 52 (FIG. 1) of semiconductor device 26 in order to form device coil 22 (FIG. 1) surrounding magnetic coil 30, discussed below.

With continued reference to FIGS. 4 and 5, conductive vias 40 are oriented in a staggered formation relative to a Y dimension 90 of IC wafer 68. The term "staggered formation" refers to conductive vias (and likewise conductive interconnects 28 and device pads 54) being arranged in multiple rows, with the elements in the rows optionally being offset relative to one another in an X dimension 91. This layout enables the implementation of device pads 54 (FIG. 1) and conductive interconnects 28 (FIG. 1) that are wider than the diameters of corresponding conductive traces 34 (FIG. 3) within interconnect layer 36 (FIG. 1) and conductive traces 44 (FIG. 1) within interconnect layer 46 (FIG. 1). After reading this specification, skilled artisans will appreciate that the pitches, feature sizes, and staggered formation of conductive vias 40 and device pads 54 may be a function of width requirements for the subsequently formed conductive interconnects 28.

Referring back to FIG. 2, IC wafer production process 64 continues with a task 92. At task 92, conductive interconnects 28 are formed at conductive vias 40 following the coupling of magnetic cores 30 to IC wafer 68. In particular, conductive interconnects 28 may be formed as stud bumps from a noble metal, such as gold, using a stud bumping technique as discussed above.

Figure 6:
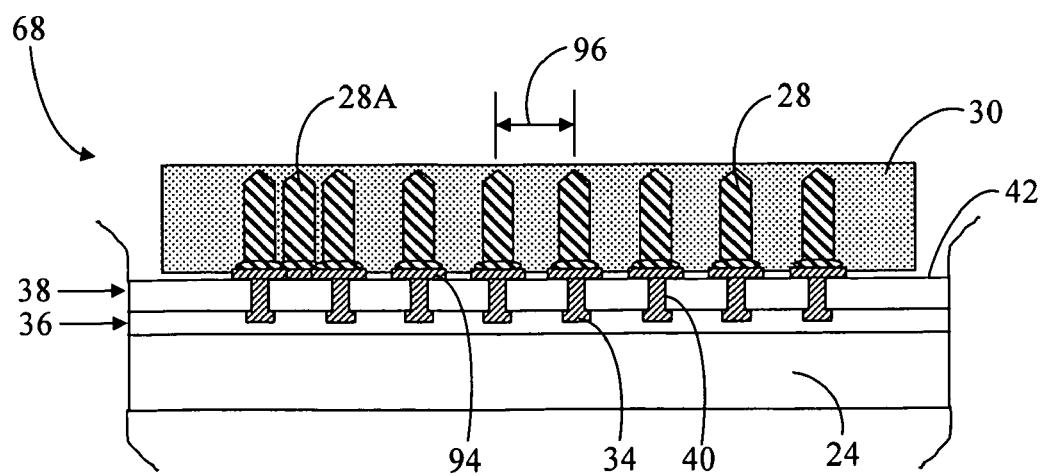
FIG. 6 shows a side view of the portion of the IC wafer of FIG. 4 further along in processing.

With reference to FIG. 6 in connection with task 92, FIG. 6 shows a representative side view of a portion of IC wafer 68 further along in processing. In particular, conductive interconnects 28 have been attached to a pad surface 94 of conductive vias 40. In FIG. 6, most conductive interconnects 28 generally appear in alignment. Due to a diameter of conductive interconnects 28, adjacent conductive interconnects 28 in a side view illustration would appear to be touching one another since a portion of conductive interconnects 28 would be in the foreground, while others are in the background in accordance with their staggered relationship. For simplicity of illustration, only one of conductive interconnects 28, delineated as conductive interconnect 28A, is placed in a background relationship relative to the other conductive interconnects 28. Conductive interconnect 28A represents one of conductive interconnects 28 that may be in a different row, relative to Y-dimension 90 in accordance with the staggered formation illustrated in FIGS. 4 and 5.

The larger diameter of conductive interconnects 28, relative to the diameters of conductive traces 34 (FIG. 1) and conductive traces 44 (FIG. 1), calls for a pitch 96 between conductive interconnects 28 positioned between integrated circuit 24 and semiconductor device 26 to be greater than, for example, pitch 74 (FIG. 3) between conductive traces 34. The staggered formation allows for a greater number of conductive traces 34, conductive traces 44, and conductive interconnects 28 than a linear formation of conductive interconnects 28. Accordingly, device coil 22 (FIG. 1) can have many more turns, resulting in a larger value inductor. In alternate embodiments calling for smaller value device coils, conductive interconnects 28 may be arranged in a linear formation, resulting in a lower number of windings of device coil 22 (FIG. 1), and a commensurate decrease in inductance value.

Following the stud bump processing of task 92, IC wafer production process 64 ends. The resulting structure of process 64 is IC wafer 68 including integrated circuits 24 having conductive traces 34 that form a portion of device coil 22 (FIG. 1), and gold stud bumped conductive interconnects 28 extending from outer surface 42 of integrated circuits 24.

Figure 7:
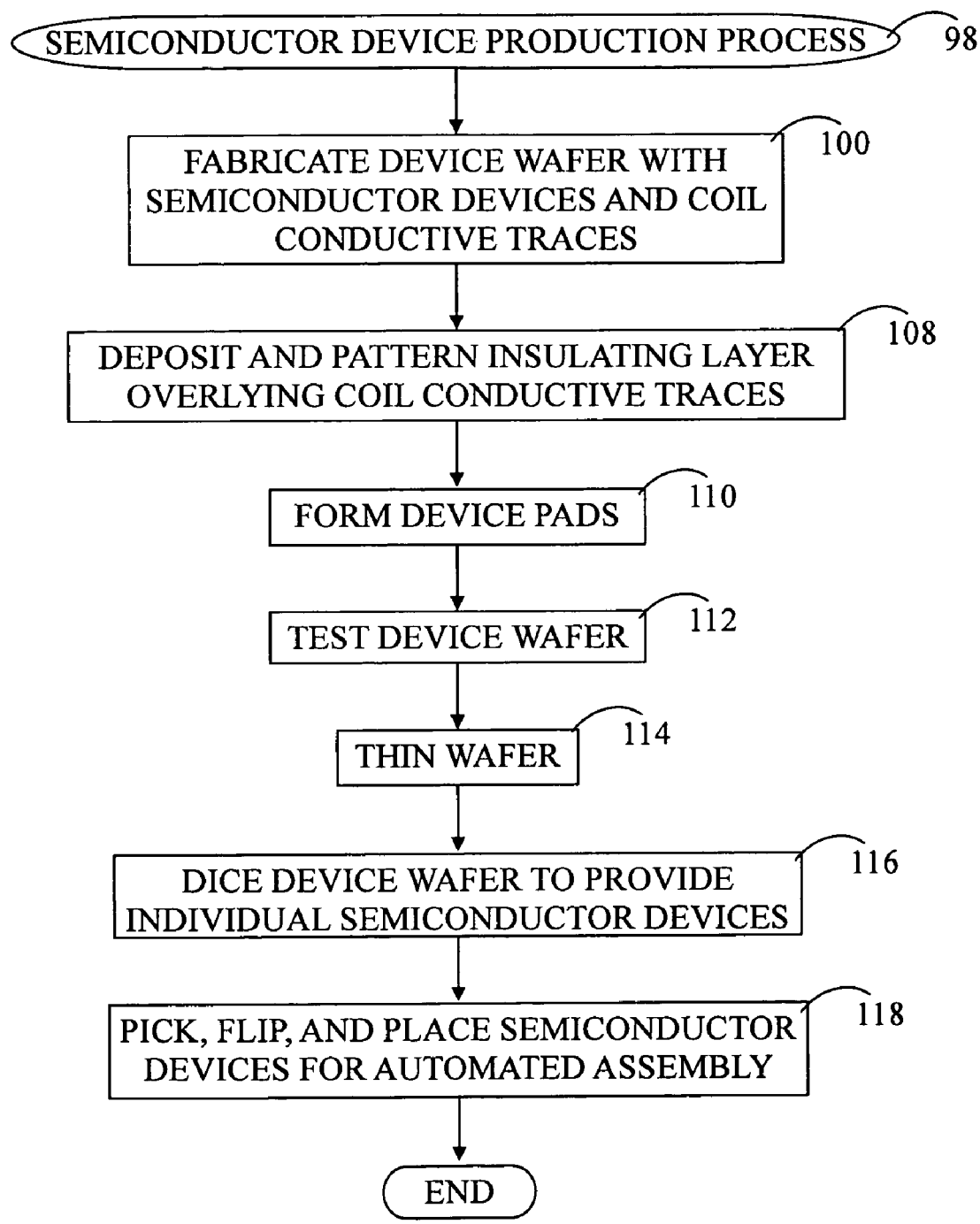
FIG. 7 shows a flowchart of a semiconductor device production process.

FIG. 7 shows a flowchart of a semiconductor device production process 98. Process 98 is performed to produce a plurality of semiconductor devices (FIG. 1), each of which includes conductive traces 44 (FIG. 1) formed at interconnect level 46 (FIG. 1).

Semiconductor device production process 98 begins with a task 100. At task 100, a semiconductor device wafer is fabricated to include semiconductor devices 26 and conductive traces 44 that make up a portion of device coil 22 (FIG. 1). In an embodiment, task 100 entails the implementation of shortened wafer process steps to create passive components for simple resistors, capacitors, and conductive traces 44. These conventional process steps are not described herein for brevity.

Figure 8:
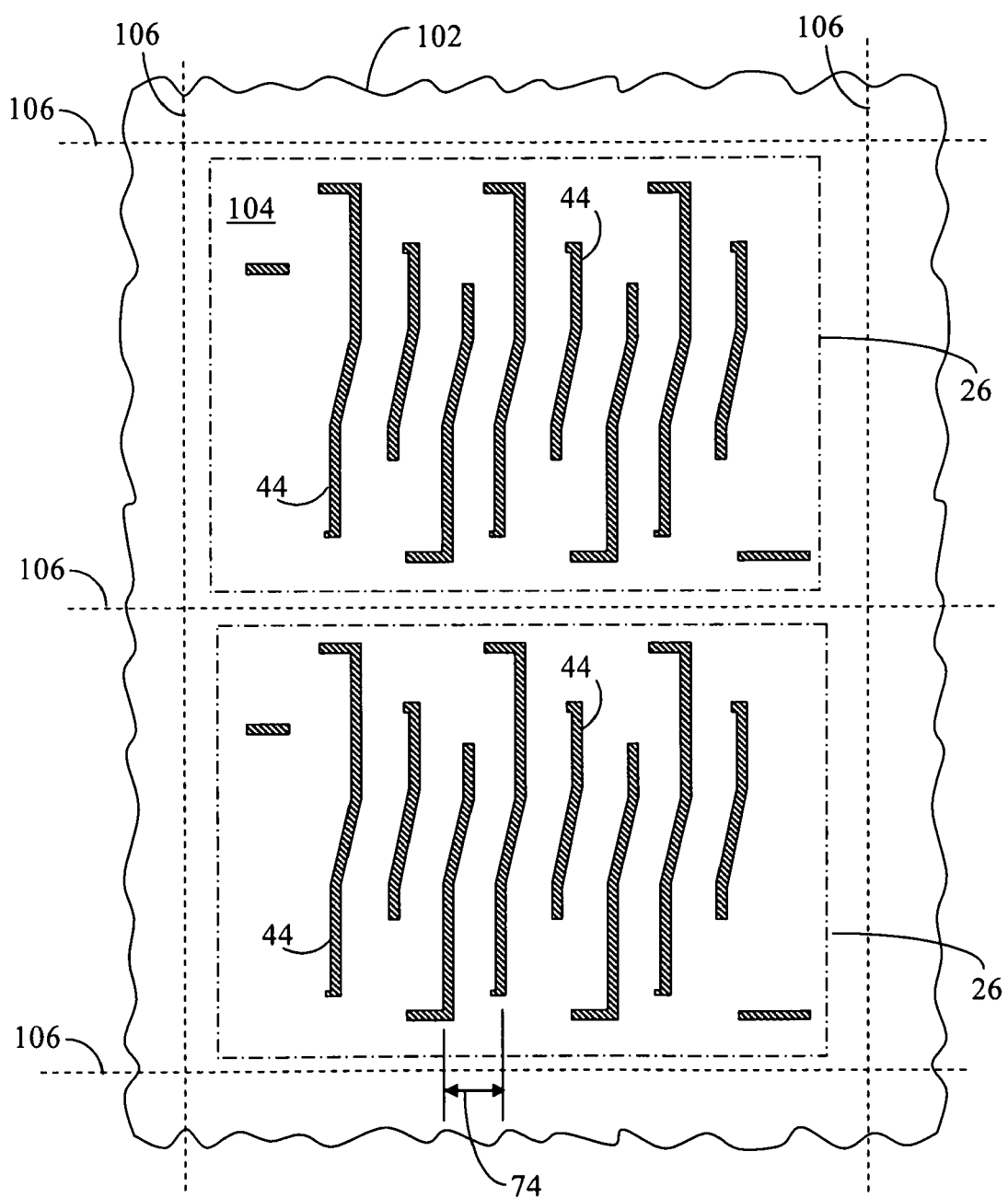
FIG. 8 shows a top view of a portion of a semiconductor device wafer having conductive traces formed thereon.

Referring to FIG. 8 in connection with task 100, FIG. 8 shows a top view of a portion of a semiconductor device wafer 102 having conductive traces 44 formed thereon. Semiconductor device wafer 102 is subjected to conventional fabrication techniques for forming passive components 43 (FIG. 1) in the active regions, or substrate, of semiconductor device wafer 100. Integrated circuits may also be fabricated into semiconductor device wafer 102. However, the shortened wafer process steps for simple resistors, capacitors, and the like results in a less costly manufacturing process of semiconductor device wafer 102.

In an embodiment, after passive components 43 are formed in the underlying layers of semiconductor device wafer 102, an adhesion/barrier layer 104 may be deposited using a conventional deposition method. Conductive traces 44 may then be formed over adhesion/barrier layer 104 at interconnect level 48 (FIG. 1). Of course, additional contacts (not shown) may be formed over adhesion/barrier layer 104 in connection with the formation of conductive traces 44. These additional contacts may interconnect with the underlying passive components 43 and are electrically isolated from conductive traces 44. Note that semiconductor device wafer 102 is illustrated with only two sets of conductive traces 44 separated by dashed lines representing saw lines 106 along which semiconductor device wafer 100 will later be sawn, or diced. Thus, saw lines 106 represent the separation between each semiconductor device 26 (represented by dash-dot-dash lines) in semiconductor device wafer 102. Although only two semiconductor devices 26 are represented in FIG. 8, it should be understood that conventional wafers allow for hundreds and often thousands of such semiconductor devices 26 on one semiconductor device wafer 102.

Conductive traces 44 may be formed by conventional deposition, patterning, and etching processes of a conductive material layer. The conductive material layer may be formed from aluminum, copper, and the like. Like conductive traces 34, conductive traces 44 are arranged substantially parallel to one another within interconnect level 46, and exhibit pitch 74 of, for example, approximately two micrometers.

Referring back to FIG. 7, following task 100, semiconductor device production process 98 continues with a task 108. At task 108, insulating layer 48 may be deposited over conductive traces 44 of interconnect level 46 (FIG. 1). Insulating layer 48 may include a photo-imageable organic film of, for example, polyimide, coated using a conventional or proprietary spin-on process. The polyimide insulating layer 48 can be developed or etched using conventional or proprietary processing to define openings 50 (FIG. 1). If necessary or desired, insulating layer 48 may be cured at elevated temperatures to release a volatile organic compound, moisture, or any combination thereof. Insulating layer 48 provides a cushioning effect against mechanical damage during subsequent thermal compression bonding of conductive interconnects 28 (FIG. 1) with device pads 54 (FIG. 1).

After insulating layer 48 is deposited and patterned at task 108, a task 110 is performed. At task 110, device pads 54 (FIG. 1) are formed at select locations on outer surface 52 (FIG. 1) of semiconductor device wafer 102. These select locations overlie openings 50 (FIG. 1) formed through insulating layer 48. As discussed above, openings 50 may have been previously filled with a conductive material prior to formation of device pads 54 in order to create an electrically conductive path between the underlying conductive traces 44 (FIG. 8) and device pads 54.

Figure 9:
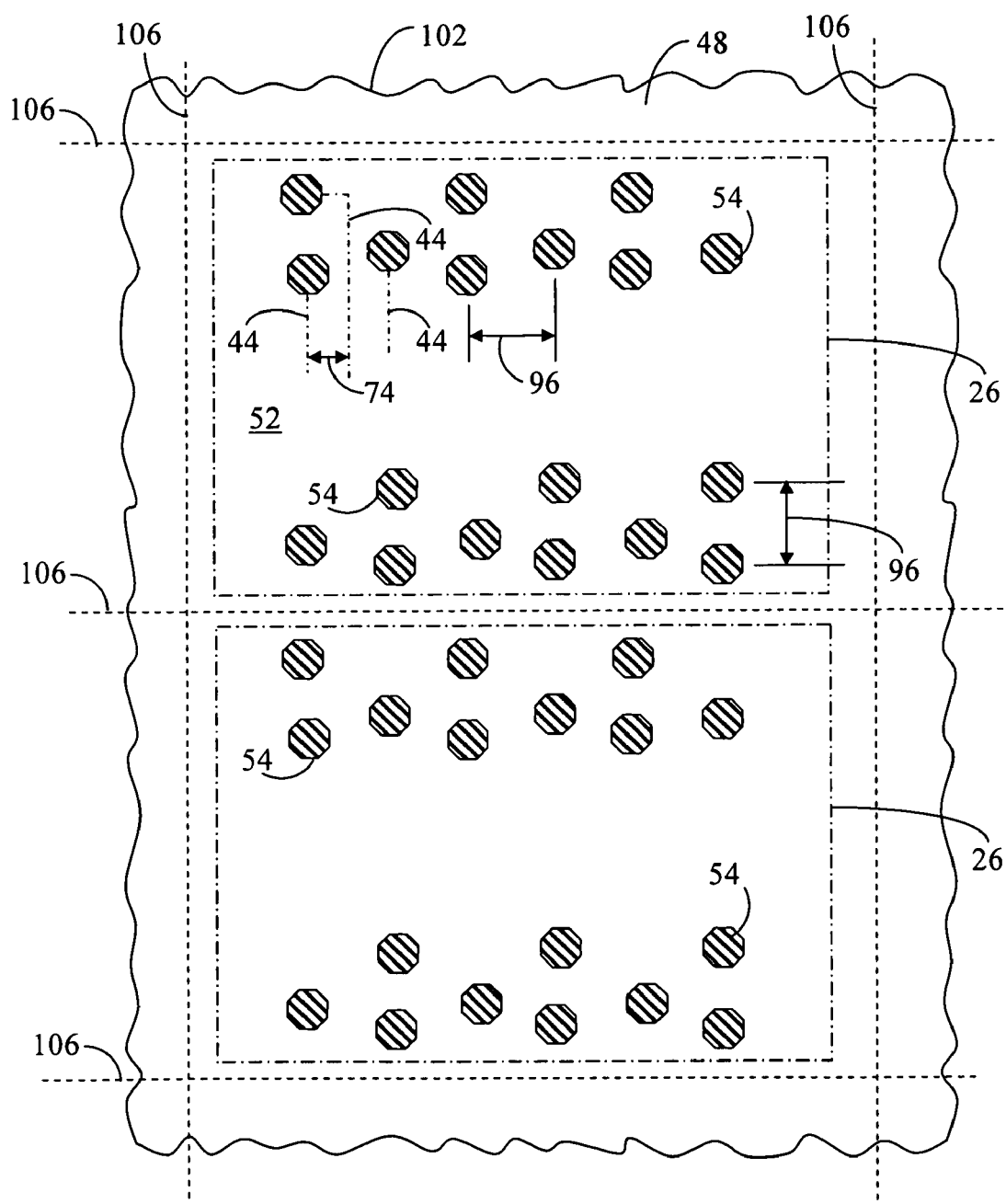
FIG. 9 shows a top view of the portion of the semiconductor device wafer of FIG. 8 further along in processing.

Referring to FIG. 9 in connection with task 110 of semiconductor device production process 98, FIG. 9 shows a top view of the portion of the semiconductor device wafer 102 of FIG. 8 further along in processing. In particular, device pads 54 are formed on insulating layer 48 that overlie conductive traces 44. In an embodiment, a metal seed layer (not shown) may be formed overlying insulating layer 48 and patterned such that a portion of the metal seed layer contacts the exposed conductive material in each of openings 50. A metal layer may then be electroplated onto the seed layer to form device pads 54. Therefore, device pads 54 provide electrical connection to the conductive metal in openings 50, which in turn, provide electrical connections to conductive traces 44 underlying insulating layer 48.

In an embodiment, the metal layer that makes up device pads 54 is a noble metal, such as gold, for ready coupling with conductive interconnects 28 (FIG. 1) during thermal compression bonding. In this embodiment, device pads 54 may be formed sufficiently thick to carry relatively high currents, to sustain probing with probe needles without damage, and to limit impact damage during thermal compression bonding. Therefore, in one embodiment, device pads 54 may be at least nine micrometers thick. Alternatively, device pads 54 may be targeted to be within a range of approximately eight to sixteen micrometers thick.

With continued reference to FIG. 9, note that device pads 54 are arranged in the staggered formation exhibiting pitch 96, as discussed above. A conventional stud bumping technique can produce stud bumps, i.e., conductive interconnects 28, exhibiting pitch 96 of approximately seventy micrometers. Since device pads 54 couple with conductive interconnects 28, pitch 96 of device pads 54 must also exhibit pitch 96 of approximately seventy micrometers. For illustrative purposes, a view conductive traces 44 are shown in ghost form extending from device pads 54. As exemplified in FIG. 9, the staggered formation of devices pads 54 exhibiting pitch 96 enables placement of conductive traces 44 exhibiting the smaller pitch 74. Accordingly, such an arrangement enables closer placement of adjacent conductive traces 34 and 44 within corresponding interconnect levels 36 and 46 in order to produce device coil 22 (FIG. 1) having a large number of windings.

Referring back to semiconductor device production process 98 (FIG. 7), following the formation of device pads 54 at task 110, a task 112 is performed. At task 112, semiconductor device wafer 102 may be tested. Testing may entail probing contacts (not shown) to test the electrical functionality of passive components 43 (FIG. 1) in semiconductor devices 26 in accordance with known procedures, as well as to verify that conductive traces 44 are electrically isolated from one another. Any semiconductor device 26 that fails testing may be mapped, identified, or inked to mark that it failed.

Following task 112, semiconductor device wafer 102 may be thinned at a task 114. For example, the back side of semiconductor device wafer 102 may be ground in accordance with known procedures to create a thinner semiconductor device wafer 102 to better fit inside thin packages.

Next, a task 116 is performed. At task 116, semiconductor device wafer 102 is diced, or sawn, along saw lines 106 (FIG. 8) to provide a plurality of individual semiconductor devices 26 having conductive traces 44 formed therein.

Following singulation at task 116, process 98 continues with a task 118. At task 118, those semiconductor devices 26 that passed testing at task 112, are picked, flipped over, and placed into tape reels suitable for automated assembly. Semiconductor device production process 98 then ends. The resulting product of semiconductor device production process 98 is a plurality of semiconductor devices 26 prepared for coupling with integrated circuits 24 of IC wafer 68 (FIG. 4), each of which has conductive traces 44 that form a portion of device coil 22 (FIG. 1).

Figure 10:
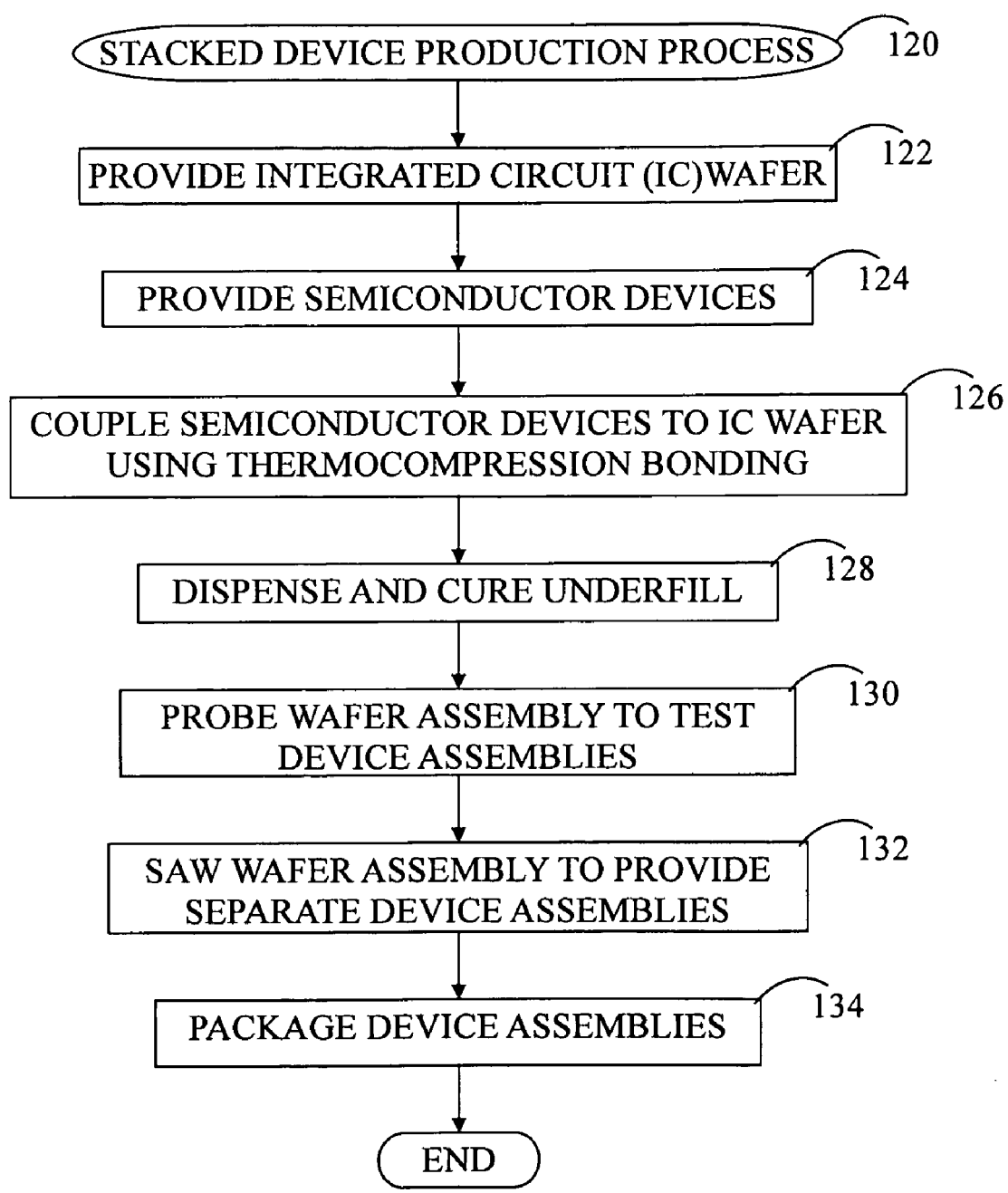
FIG. 10 shows a flowchart of a stacked device production process.

FIG. 10 shows a flowchart of a stacked device production process 120. Stacked device production process 120 may be performed to produce stacked semiconductor device assembly 20 (FIG. 1) including integrated device coil 22 (FIG. 1). Production process 120 illustrates a generalized process flow for producing a plurality of stacked semiconductor device assemblies 20.

Process 120 begins with a task 122. At task 122, an integrated circuit (IC) wafer 68 (FIG. 3) having a plurality of integrated circuits, such as integrated circuit 24, formed thereon is provided. In an embodiment, providing task 122 may entail the procurement of a IC wafer 68 having been produced through the execution of IC wafer production process 64 (FIG. 2). That is, a manufacturing facility performing operations of stacked device production process 120 may obtain IC wafer 68 provided from an external source. The external source may fabricate IC wafer 68 in accordance with IC wafer production process 64, or otherwise procure IC wafer 68. Alternatively, providing task 122 may entail production of IC wafer 68, including a plurality of integrated circuits 24 (FIG. 1) each having conductive traces 34 (FIG. 1), at the manufacturing facility performing stacked device production process 120.

Process 120 continues with a task 124. At task 124, a plurality of semiconductor devices, such as semiconductor device 26, is provided. Again, providing task 124 may entail the procurement of a semiconductor devices 26 (FIG. 1) having been produced through the execution of semiconductor device production process 98 (FIG. 7). That is, a manufacturing facility performing operations of stacked device production process 120 may obtain semiconductor devices 26 previously placed on a tape reel, as discussed above, from an external source. The external source may fabricate semiconductor devices 26 in accordance with semiconductor device production process 98, or otherwise procure semiconductor devices 26. Alternatively, providing task 124 may entail production of semiconductor devices 26 having conductive traces 44 (FIG. 1), at the manufacturing facility performing stacked device production process 120.

A task 126 is performed in response to tasks 122 and 124. At task 126, semiconductor devices 26 are coupled to integrated circuits 24 of IC wafer 68. In particular, a thermal compression bonding technique is employed to couple device pads 54 (FIG. 1) of semiconductor devices 26 with corresponding conductive interconnects 28 (FIG. 1) to form a wafer assembly that includes a plurality of stacked semiconductor device assemblies 20.

Next, at a task 128, an underfill liquid may be dispensed next to one edge of each of semiconductor devices 26. Capillary action pulls the underfill material in between semiconductor device 26 and its associated integrated circuit 24. The underfill material may then be cured, for example, by heating.

Process 120 continues with a task 130. At task 130, the individual stacked semiconductor device assemblies 20 formed on the wafer assembly may be tested. For example, testing may include probing contacts (not shown) to test the electrical operation of each assembly 20, in accordance with known procedures. Any device assemblies 20 formed on the wafer assembly which fail testing may be inked to mark that they failed. Wafer level burn-in may also be performed on the entire wafer assembly before further packaging per known procedures.

Following task 130, a task 132 is performed at which the wafer assembly is sawn, diced, or otherwise separated along saw lines 72 (FIG. 4) to produce a plurality of separated stacked semiconductor device assemblies 20. In an embodiment, the wafer assembly may be flooded with water, such as, for example, deionized water. This may help minimize silicon dust from getting between the wafer assembly and semiconductor devices 26 during subsequent sawing. The wafer assembly is then sawn, or diced, to separate stacked semiconductor device assemblies 20.

Stacked device production process 120 then proceeds with a task 134. At task 134, each separated stacked semiconductor device assembly 20 (FIG. 1) with integral device coil 22 (FIG. 1) can then be individually packaged into any type of semiconductor packaging. For example, during packaging, various contacts (not shown) in assembly 20 can be wire bonded to a package substrate. The device assemblies 20 can be packaged, for example, into a quad-flat no-lead (QFN) package, a ball-grid array (BGA) package, or any other type of package. Process 134 ends following task 134.

Figure 11:
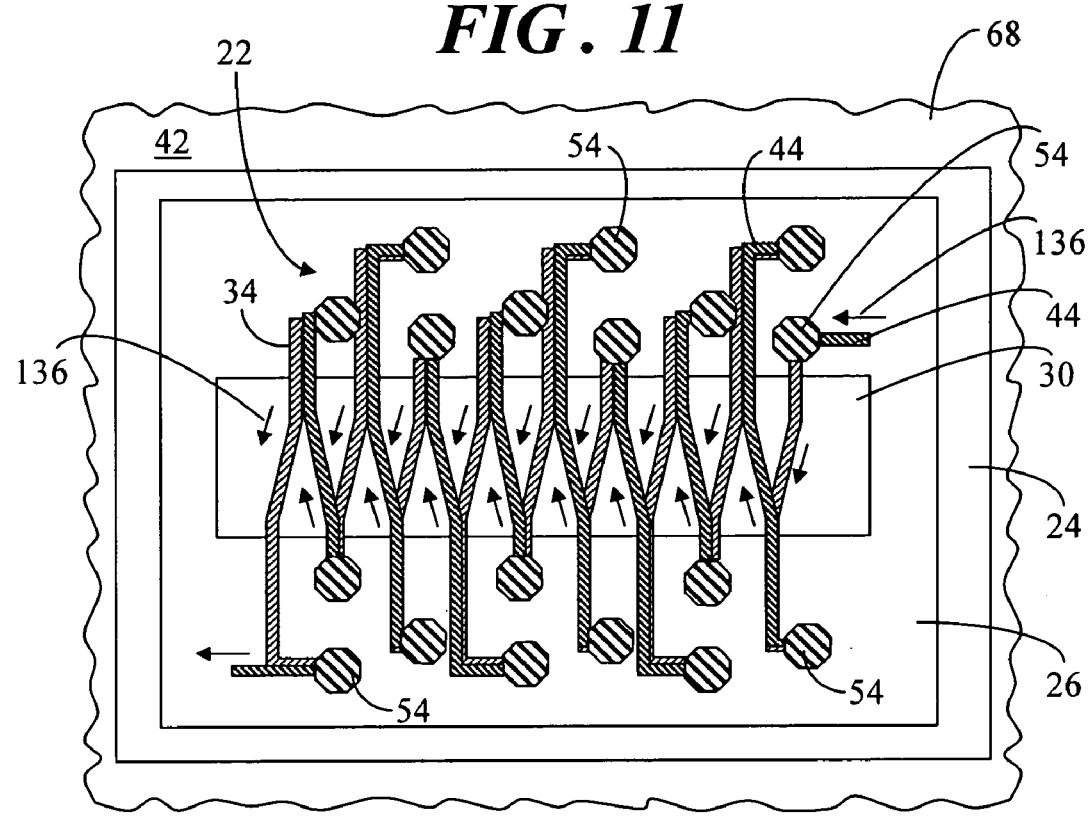
FIG. 11 shows an illustrative view of a semiconductor device stacked on an integrated circuit device to form the integrated device coil.

FIG. 11 shows an illustrative view of semiconductor device 26 stacked on integrated circuit 24 to form integrated device coil 22. As represented in FIG. 11, outer surface 52 of semiconductor device 26 is placed face down on outer surface 42 of integrated circuit 24. Accordingly, conductive traces 44 in semiconductor device 26 align with conductive traces 34 in integrated circuit 24. Conductive traces 34 are electrically coupled with conductive traces 44 through device pads 54 and conductive interconnects 28 (not visible). For illustrative purposes, conductive traces 34 are slightly offset from conductive traces 44 so that both are visible in FIG. 11.

Figure 12:
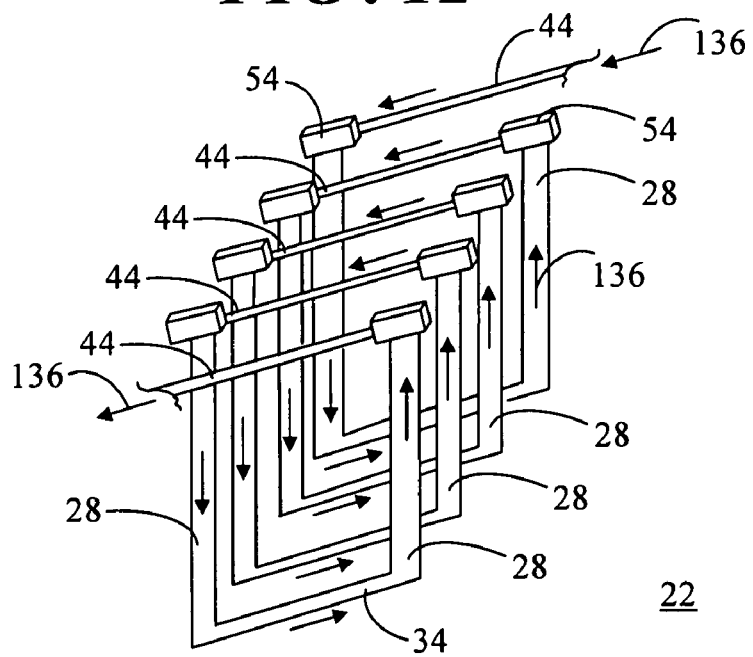
FIG. 12 shows a perspective illustration of an integrated device coil formed through the stacked assembly of the semiconductor device with the integrated circuit device.

FIG. 12 shows a perspective illustration of integrated device coil 22 formed through the stacked assembly of semiconductor device 26 with integrated circuit device 24. FIG. 12 is provided to illustrate the non-planar properties of device coil 22 through the alternating electrical connection of conductive traces 34, conductive interconnects 28, and conductive traces 44. However, the windings of device coil 22 illustrated in FIG. 12 do not vary in size in accordance with the staggered formation shown in FIG. 11 for simplicity of illustration.

With reference to FIGS. 11 and 12, in this embodiment, integrated device coil 22 may be an inductor. Current, represented by a series of arrows 136 may enter device coil at an input 138 of conductive traces 44 coupled to external components (not shown). Current 136 conducts through input 138 of conductive traces 44 through device pad 54, through conductive interconnect 28 to an underlying one of conductive traces 34, where current 136 conducts through a corresponding conductive interconnect 28, through another device pad 54, to one of conductive traces 44, and so forth. Accordingly, a continuous device coil 22 is formed from alternating electrical connection of conductive traces 34, conductive interconnects 28, and conductive traces 44.

Current 136 through the device coil 22 creates a magnetic flux proportional to the current. A change in this current creates a change in magnetic flux that, in turn, by electromotive force (EMF) acts to oppose this change in current. Inductance is a measure of the amount of EMF generated for a unit change in current. The number of loops, the size of each loop, and the material it is wrapped around all affect the inductance.

The design of fine pitched conductive traces 34, 44 in both integrated circuit 24 and semiconductor device 26 connected with many gold conductive interconnects 28 arranged in a staggered formation form a continuous coiled inductor 22 with many windings. The height of gold conductive interconnects 28 coupled with device pads 54, of at least fifty micrometers, can be controlled by the thickness of magnetic core 30 sandwiched between integrated circuit 24 and semiconductor device 26. The fine pitch of conductive traces 34, 44 enable their integration in chips, such as integrated circuit 24 and semiconductor device 26. In addition, the implementation of conductive interconnects 28, in the form of gold stud bumps enables the formation of a non-planar, high inductance value inductor with many windings wrapped around a material with a high permeability. Accordingly, the magnetic flux is further increased by coiling device coil 22 around magnetic core 30.

The teachings set forth above can be extended to the formation of a transformer. A transformer is a device that transfers electrical energy from one circuit to another through inductively coupled electrical conductors. A changing current in the first/primary circuit creates a changing magnetic field. This changing magnetic field induces a changing voltage in the second/secondary circuit. In an embodiment, the windings of two device coils 22 may be interleaved to minimize size, leakage inductance, and stray capacitance so as to improve frequency response. The transformer embodiment is discussed below in connection with FIGS. 13-15.

Figure 13:
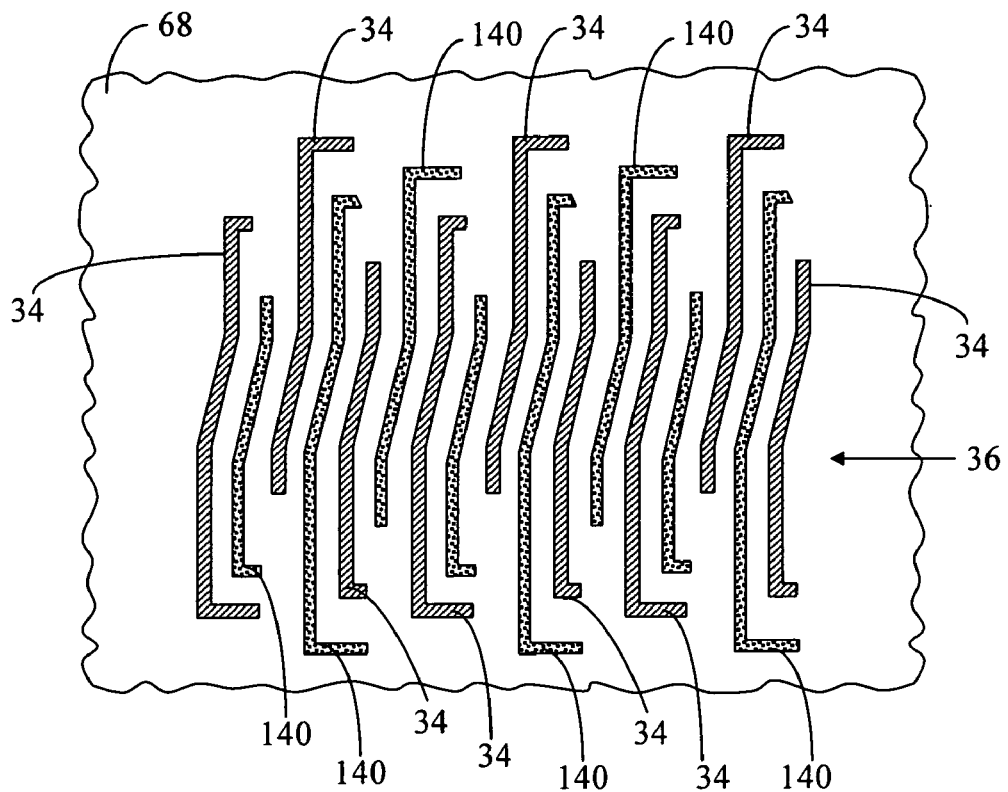
FIG. 13 shows a top view of a portion of an integrated circuit (IC) wafer having conductive traces formed thereon in accordance with another embodiment.

FIG. 13 shows a top view of a portion of an integrated circuit (IC) wafer 68 having conductive traces formed thereon in accordance with another embodiment. In particular, IC wafer 68 includes conductive traces 34, as discussed above. IC wafer 68 further includes conductive traces 140 in alternating arrangement with conductive traces 34 and electrically isolated from conductive traces 34. Conductive traces 140 may be formed concurrently at interconnect level 36 with conductive traces 34 in accordance with IC wafer production process 64 (FIG. 2).

Figure 14:
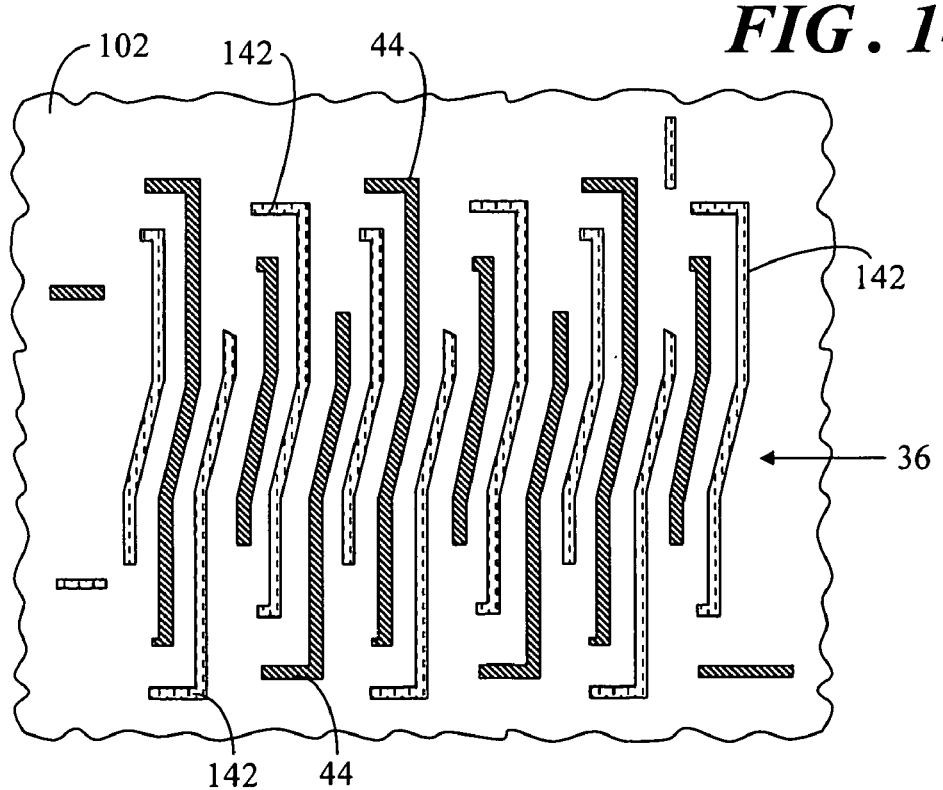
FIG. 14 shows a top view of a portion of a semiconductor device wafer having conductive traces formed thereon in accordance with another embodiment.

FIG. 14 shows a top view of a portion of a semiconductor device wafer 102 having conductive traces formed thereon in accordance with another embodiment. In particular, semiconductor device wafer 102 includes conductive traces 44, as discussed above. Semiconductor device wafer 102 further includes conductive traces 142 in alternating arrangement with conductive traces 44 and electrically isolated from conductive traces 44. Conductive traces 142 may be formed concurrently at interconnect level 46 with conductive traces 44 in accordance with semiconductor device production process 98 (FIG. 7).

Figure 15:
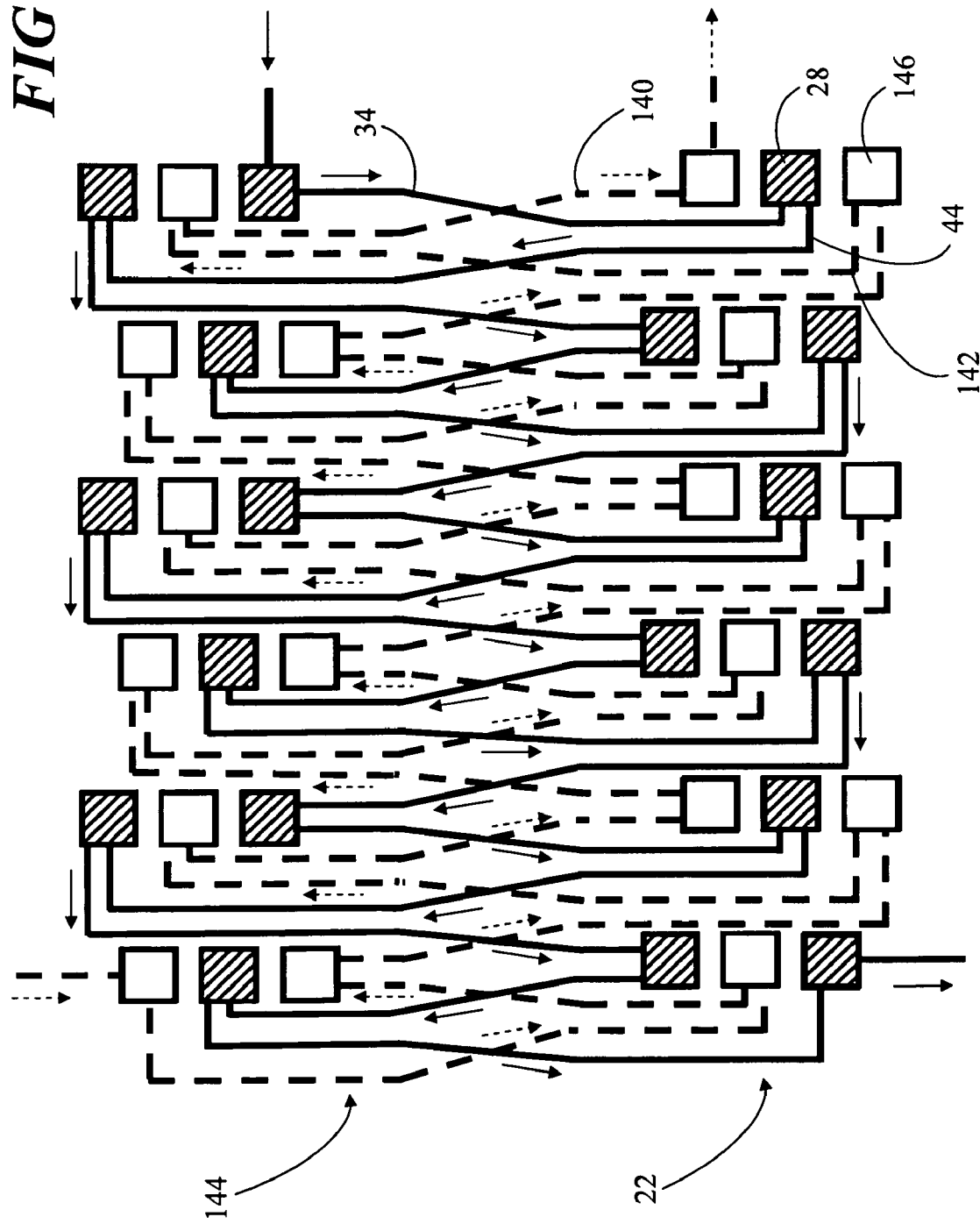
FIG. 15 shows an illustrative view of the conductive traces of FIGS. 13 and 14 that form a pair of integrated device coils.

FIG. 15 shows an illustrative view of the four sets of conductive traces that form a pair of integrated device coils. In particular, a device coil 144 is interleaved with device coil 22. The four sets of conductive traces include conductive traces 34 and 140 at interconnect level 36 of integrated circuit 24 and conductive traces 44 and 142 at interconnect level 46 of semiconductor device 26. As shown, conductive interconnects 28 electrically couple conductive traces 34 with conductive traces 44 to form device coil 22, as discussed above. As illustrated, conductive traces 34 and 44 forming device coil 22 are represented by solid lines. In addition, conductive interconnects 146 electrically couple conductive traces 140 with conductive traces 142 to form device coil 144. As illustrated, conductive traces 140 and 142 forming device coil 144 are represented by dashed lines. In this example, device coil 22 forms the primary coil, or circuit, of a transformer, and device coil 144 forms the secondary coil, or circuit, of the transformer.

Electrical isolation of conductive traces 34 and 140 at interconnect level 36 of integrated circuit 24, electrical isolation of conductive traces 44 and 142 at interconnect level 46 of semiconductor device 26, and electrical isolation between adjacent conductive interconnects 28 and 148 ensure that primary device coil 22 is electrically isolated from the interleaved secondary device coil 144. Although the transformer configuration of FIG. 15 shows device coils 22 and 146 as being interleaved, in an alternative embodiment coils 22 and 146 need not be interleaved, but may instead be arranged in serial arrangement, i.e., side-by-side, wrapped around magnetic coil 30 (FIG. 1).

Embodiments of the invention entail a stacked semiconductor device assembly having an integrated device coil and a method of producing the stacked semiconductor device assembly. Processing methodology calls for forming fine pitched conductive traces at interconnect levels of two chip devices, e.g., an integrated circuit and a semiconductor device. Larger pitched conductive interconnects, in the form of gold stud bumps, are arranged in a staggered formation and interconnect the conductive traces of the two chip devices to form a continuous device coil. As such, the continuous device coil is formed from alternating electrical connection of the conductive traces of each of the two chips along with the conductive interconnects. The stacked packaging, the fine pitched conductive traces, and the staggered formation of the conductive interconnects yields a device coil with many windings to achieve high inductance value. The inductance value in further enhance by placement of a magnetic core sandwiched between the two chip devices and such that the device coil surrounds the magnetic coil.

Processing methodology further calls for the formation of gold device pads on the semiconductor device that are electrically connected at selected locations with the underlying conductive traces. Gold conductive interconnects are formed utilizing a stud bumping technique to form the conductive interconnects extending above the surface of the integrated circuit and electrically connected at selected locations with the underlying conductive traces. A gold-to-gold thermal compression interconnection technique of the device pads with the conductive interconnects eliminates the intermetallic problems commonly associated with the use of two different metals which are ultrasonically bonded. Moreover, such processing methodology can be readily and cost effectively implemented within standard stacked wafer assembly processes. Accordingly, a non-planar high inductance value device coil can be implemented in a "system-in-a-package" (SIP) or a "chip stack" configuration.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method comprising:
   providing a first device, said first device having a plurality of first conductive traces formed at a first interconnect level;
   forming conductive interconnects on a first outer surface of said first device, said conductive interconnects being electrically connected to said first conductive traces, and each of said conductive interconnects extending above said first outer surface of said first device;
   providing a second device, said second device having a plurality of second conductive traces formed at a second interconnect level;
   forming device pads on a second outer surface of said second device, said device pads being electrically connected to said second conductive traces;
   coupling said second device to said first device via attachment of said conductive interconnects to said device pads to provide a device assembly, said device assembly including a continuous device coil formed from alternating electrical connection of said first conductive traces, said conductive interconnects, and said second conductive traces.

2. A method as claimed in claim 1 further comprising attaching a magnetic core to said first outer surface of said first device such that said conductive interconnects are positioned at opposing sides of said magnetic core.

3. A method as claimed in claim 2 wherein said attaching operation is performed prior to said forming said conductive interconnects on said first outer surface of said first device.

4. A method as claimed in claim 1 wherein said forming said conductive interconnects on said first outer surface of said first device comprises utilizing a stud bumping technique to form said conductive interconnects as stud bumps.

5. A method as claimed in claim 1 wherein:
   said forming said conductive interconnects forms said conductive interconnects in a staggered formation; and
   said forming said device pads forms said device pads in said staggered formation to correspond with an orientation of said conductive interconnects.

6. A method as claimed in claim 1 wherein:
   said forming said conductive interconnects forms said conductive interconnects from a noble metal; and
   said forming said device pads forms said device pads from said noble metal.

7. A method as claimed in claim 6 wherein said noble metal is gold.

8. A method as claimed in claim 1 wherein said coupling comprises performing thermal compression bonding of said device pads with said conductive interconnects.

9. A method as claimed in claim 1 wherein:
   said providing said first device provides said first device having a plurality of third conductive traces formed at said first interconnect level;
   said providing said second device provides said second device having a plurality of fourth conductive traces formed at said second interconnect level;
   said forming said conductive interconnects includes forming second conductive interconnects on said first outer surface of said first device, said second conductive interconnects being electrically connected to said third conductive traces, and each of said second conductive interconnects extending above said first outer surface of said first device; and
   said forming said device pads includes forming second device pads on said second outer surface of said second device at said second openings, said second device pads being electrically connected to said fourth conductive traces, and following said coupling operation, said device assembly further includes a second continuous device coil formed from alternating electrical connection of said third conductive traces, said second conductive interconnects, and said fourth conductive traces, said second continuous device coil being electrically isolated from said continuous device coil.

10. A method as claimed in claim 9 wherein:
    said providing said first device provides said first device having said first conductive traces in alternating arrangement with said third conductive traces; and said providing said second device provides said second device having said second conductive traces in alternating arrangement with said fourth conductive traces.

11. A method as claimed in claim 1 further comprising:

providing a wafer including a plurality of first devices, said first device being one of said plurality of first devices, each of said plurality of first devices having said plurality of first conductive traces formed at said first interconnect level, wherein said forming said conductive interconnects forms said conductive interconnects on said first outer surface of said each of said plurality of first devices;

said providing a second device provides a plurality of second devices, said second device being one of said plurality of second devices, each of said plurality of second devices having said plurality of second conductive traces formed at said second interconnect level, wherein said forming said device pads forms said device pads on said second outer surface of said each of said plurality of second devices;

said coupling operation couples one each of said plurality of second devices to one each of said plurality of first devices to provide a plurality of device assemblies, said device assembly being one of said device assemblies; and said method further comprises separating said wafer between said device assemblies to provide a plurality of separated devices assemblies, each of said separated device assemblies including said continuous device coil.

12. A device assembly comprising:

a first device having a plurality of first conductive traces formed at a first interconnect level;

a plurality of conductive interconnects extending above a first outer surface of said first device, said conductive interconnects being electrically connected to said first conductive traces; and a second device having a plurality of second conductive traces formed at a second interconnect level, said second device including device pads at selected locations on a second outer surface of said second device, said device pads being electrically connected to said second conductive traces, and said conductive interconnects being coupled with corresponding ones of said device pads to form a continuous device coil formed from alternating electrical connection of said first conductive traces, said conductive interconnects, and second conductive traces.

13. A device assembly as claimed in claim 12 further comprising a magnetic core interposed between said first device and said second device, said continuous device coil wrapping around said magnetic core.

14. A device assembly as claimed in claim 13 wherein opposing surfaces of said magnetic core abut said first and second outer surfaces.

15. A device assembly as claimed in claim 12 wherein said conductive interconnects include a plurality of stud bumps.

16. A device assembly as claimed in claim 12 wherein said device pads and said stud bumps are formed from a noble metal.

17. A device assembly as claimed in claim 12 wherein:

said first device further includes a plurality of third conductive traces formed at said first interconnect level;

said second device further includes a plurality of fourth conductive traces formed at said second interconnect level and second device pads at selected locations on said second outer surface of said second device, said second device pads being electrically connected to said fourth conductive traces; and said device assembly further includes a plurality of second conductive interconnects extending above said first outer surface of said first device, said second conductive interconnects being electrically connected to said third conductive traces, and said second conductive interconnects being coupled with corresponding ones of said second device pads to form a second continuous device coil formed from alternating electrical connection of said third conductive traces, said second conductive interconnects, and said fourth conductive traces, said second continuous device coil being electrically isolated from said continuous device coil.

18. A device assembly as claimed in claim 17 wherein:

said first conductive traces are in alternating arrangement with said third conductive traces; and said second conductive traces are in alternating arrangement with said fourth conductive traces.

19. A method comprising:

providing a wafer including a plurality of first devices, each of said plurality first devices including a plurality of first conductive traces formed at a first interconnect level;

attaching a magnetic core to a first outer surface of said each first device;

forming stud bumps on said first outer surface of said each first device positioned at opposing sides of said magnetic core, said stud bumps being formed by utilizing a stud bumping technique, said stud bumps being electrically connected to said first conductive traces, and each of said stud bumps extending above said first outer surface of said each first device;

providing a plurality of second devices, each of said second devices having a plurality of second conductive traces formed at a second interconnect level;

forming device pads on a second outer surface of said each second device, said device pads being electrically connected to said second conductive traces;

coupling one each of said plurality of second devices to one each of said plurality of first devices via attachment of said stud bumps to said device pads to provide a plurality of device assemblies; and separating said wafer between said device assemblies to provide a plurality of separated devices assemblies, each of said separated device assemblies including a continuous device coil formed from alternating electrical connection of said first conductive traces, said stud bumps, and said second conductive traces.

20. A method as claimed in claim 19 wherein:

said forming said stud bumps forms said stud bumps from a noble metal;

said forming said device pads forms said device pads from said noble metal; and said coupling comprises utilizing thermal compression bonding of said device pads with said stud bumps.

* * * * *